US008258792B2

(12) United States Patent
Vandensande

(10) Patent No.: US 8,258,792 B2
(45) Date of Patent: Sep. 4, 2012

(54) MONITORING SYSTEM AND METHOD

(75) Inventor: Geert Vandensande, Berbroek (BE)

(73) Assignee: Semiconductor Components Industries, LLC., Phoenix, AZ (US)

(*) Notice: Subject to any disclaimer, the term of this patent is extended or adjusted under 35 U.S.C. 154(b) by 455 days.

(21) Appl. No.: 12/463,862

(22) Filed: May 11, 2009

(65) Prior Publication Data
US 2010/0283473 A1 Nov. 11, 2010

(51) Int. Cl.
G01N 27/416 (2006.01)
H03M 1/10 (2006.01)

(52) U.S. Cl. .......... 324/426; 320/162; 341/120

(58) Field of Classification Search .......... 320/132, 320/161, 162; 324/433; 341/120
See application file for complete search history.

(56) References Cited

U.S. PATENT DOCUMENTS

| 5,170,124 | A | 12/1992 | Blair et al. | |
|---|---|---|---|---|
| 5,675,233 | A | 10/1997 | Kaneko et al. | |
| 6,268,710 | B1 * | 7/2001 | Koga | 320/162 |
| 6,404,166 | B1 | 6/2002 | Puchianu | |
| 6,603,287 | B2 * | 8/2003 | Morimoto et al. | 320/150 |
| 6,664,761 | B2 * | 12/2003 | Yudahira et al. | 320/116 |
| 6,891,352 | B2 | 5/2005 | Miyazaki et al. | |
| 7,489,112 | B2 * | 2/2009 | Ishikawa et al. | 320/161 |
| 2001/0026161 | A1 | 10/2001 | Furukawa | |
| 2003/0030442 | A1 | 2/2003 | Sugimoto | |
| 2004/0251874 | A1 | 12/2004 | Petitdidier | |
| 2007/0182377 | A1 | 8/2007 | Vandensande | |

FOREIGN PATENT DOCUMENTS

WO    WO 2005/017545 A    2/2005

* cited by examiner

Primary Examiner — Timothy J Dole
(74) Attorney, Agent, or Firm — Rennie William Dover

(57) ABSTRACT

A method and system for monitoring a voltage of a battery cell or a battery stack. A first monitoring unit has a first plurality of battery monitoring nodes, first and second data ports, a first supply port switchably coupled to the first plurality of battery monitoring nodes, a second supply port switchably coupled to the first plurality of battery monitoring nodes, and a third supply port. A controller is connected to the first monitoring unit. Alternatively, a reference voltage may be connected to the controller or it may be connected to the first monitoring unit.

20 Claims, 9 Drawing Sheets

MONITORING SYSTEM AND METHOD

TECHNICAL FIELD

The present invention relates, in general, to batteries and, more particularly, to monitoring a battery stack.

BACKGROUND

Battery stacks are used in many applications including automotive, aerospace, airline, nautical, computer, communications, heavy equipment, remote sensing, etc. The battery stacks are typically arranged in series with one another to provide a power supply of a particular rated voltage to drive an electrical load. Each battery within the battery stack comprises a number of individual battery cells. The lifetime of the battery is strongly dependent on the way in which the battery is charged and discharged and will be reduced by over-charging the cells or over-discharging the cells. In addition, it is desirable to keep all the cells of a battery stack at the same capacity. This corresponds to keeping all the cells at about the same open circuit voltage. Use of the battery and over-discharge of one cell will impact the lifetime of that cell and of the battery. For example, the capacity of a battery cell that is 50 millivolts (mV) different from a battery cell operating at its nominal voltage is 5 percent (%) lower than the capacity of the battery cell operating at its nominal voltage. This difference may be unacceptable in the applications described above. Thus, battery manufacturers are constantly striving to find better and more accurate measurement techniques for measuring the voltage across battery cells. Along with improving measurement techniques, battery manufacturers are searching for ways to balance the cell voltages within a battery stack.

It has been found that one source of error in a battery monitoring and control unit is the voltage reference source of the unit. These units are typically only accurate to +/−1% over the temperature range from −40 degrees Celsius (° C.) to 150° C. For a maximum cell voltage of 4.2V this gives a possible range of error of +/−42 mV, which is typically too high for many battery applications.

Accordingly, it would be advantageous to have a circuit and a method for monitoring and balancing the voltage of a battery stack and the voltages of the cells within a battery stack. It would of further advantage for the circuit and method to be cost efficient.

BRIEF DESCRIPTION OF THE DRAWINGS

The present invention will be better understood from a reading of the following detailed description, taken in conjunction with the accompanying drawing figures, in which like reference characters designate like elements and in which.

DETAILED DESCRIPTION

Generally, the present invention provides a monitoring system and a method for monitoring one or more battery cells or one or more batteries. In accordance with an embodiment of the present invention, a first monitoring unit is used to measure a voltage of a first cell of a first battery and to generate a first measurement result. Measuring the voltage of the first cell of the first battery includes using a first reference voltage. A second monitoring unit is used to measure the first reference voltage and to generate a second measurement result. A first correction factor suitable for use in correcting a set of measurements from at least one of the first and second monitoring units is calculated using the first measurement result and the second measurement result.

In accordance with another embodiment, a first monitoring unit has a first plurality of battery monitoring nodes, first and second data ports, a first supply port switchably coupled to the first plurality of battery monitoring nodes, a second supply port switchably coupled to the first plurality of battery monitoring nodes, and a third supply port. A controller has at least first, second, and third nodes, the first node coupled to the first data port, the second node coupled to the second supply port, and the third node coupled for receiving a reference voltage.

In accordance with yet another embodiment, a monitoring system, comprises a first monitoring unit that has a first plurality of battery monitoring nodes, first and second data ports, a first supply port switchably coupled to the first plurality of battery monitoring nodes, a second supply port switchably coupled to the first plurality of battery monitoring nodes, a third supply port, and a first reference port switchably coupled to the first plurality of battery monitoring nodes and second reference port switchably coupled to the first plurality of battery monitoring nodes. A controller has at least one port coupled to the first data port.

Figure 1:
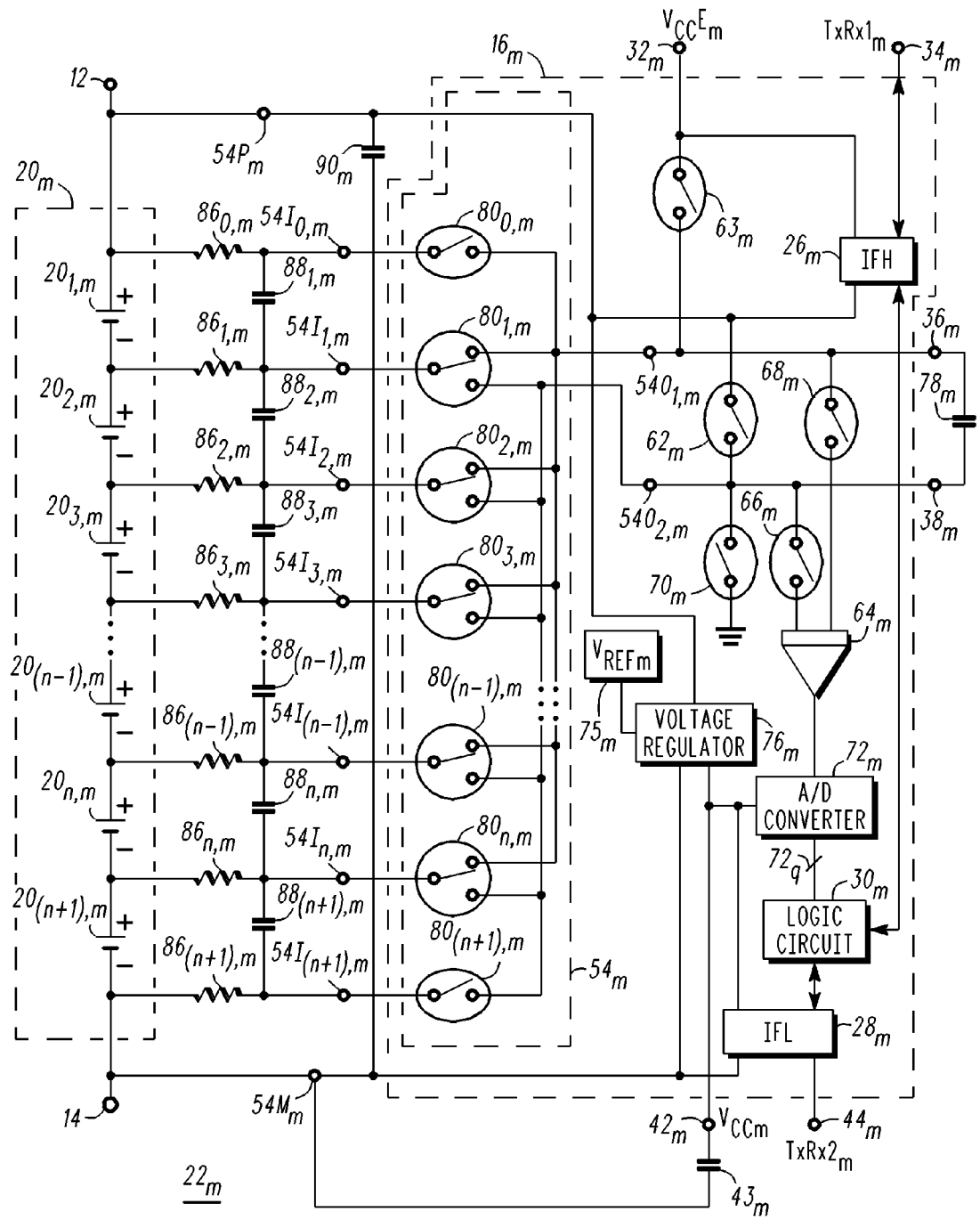
FIG. 1 is a schematic diagram of a portion of a battery system in accordance with an embodiment of the present invention.

Referring to FIG. 1, a local battery module $22_m$ comprising a battery unit $20_m$ coupled to a battery monitor control unit $16_m$ is illustrated. It should be noted that the subscript "m" represents an integer. Battery monitor control unit $16_m$ is comprised of a high side interface (IFH) circuit $26_m$ and a low side interface (IFL) circuit $28_m$ coupled to a logic circuit $30_m$. IFH circuit $26_m$ is referred to as a high side interface circuit because it is connected to a higher voltage potential of battery unit $20_m$ than IFL circuit $28_m$. Similarly, IFL circuit $28_m$ is referred to as a low side interface circuit because it is connected to a lower voltage potential of battery unit $20_m$ than IFH circuit $26_m$. IFH circuit $26_m$ has a terminal coupled to an input/output node $32_m$ for receiving a source of operating potential $V_{CC}E_m$ and a terminal coupled to an input/output node $34_m$ for transmitting and receiving control signals $Tx/Rx1_m$. IFL circuit $28_m$ has a terminal coupled to an input/output node $42_m$ for receiving a source of operating potential $V_{CCm}$ and a terminal coupled to an input/output node $44_m$ for transmitting and receiving control signals $Tx1/Rx2_m$. Input/output nodes $32_m$ and $42_m$ may be referred to as supply nodes and input/output nodes $34_m$ and $44_m$ may be referred to as data nodes. Input/output nodes $32_m$ and $42_m$ and input/output nodes $34_m$ and $44_m$ serve as selectable input ports. Battery monitor control unit $16_m$ further comprises a selection device $54_m$ such as, for example, a multiplexer having inputs $54I_{0,m}$, $54I_{1,m}, \ldots, 54I_{(n-1),m}, 54I_{n,m}, 54I_{(n+1),m}$, outputs $54O_{1,m}$ and $54O_{2,m}$, a positive supply input terminal $54P_m$, and a negative supply input terminal $54M_m$. It should be noted that the subscript "n" represents an integer. Selection device $54_m$ is not limited to being a multiplexer, but may be a switch, a plurality of switches, or the like.

Supply input terminal 54Pm is connected to an input of IFH circuit $26_m$ and to output $54O_{2,m}$ through a switch $62_m$. IFH circuit $26_m$ is coupled to supply node $32_m$ for receiving source of operating potential $V_{CC}E_m$, and to supply input terminal $54P_m$, which serves as a local ground. Supply input terminal $32_m$ is connected to an input of IFH circuit $26_m$ and to output $54O_{1,m}$ through a switch $63_m$. Output $54O_{2,m}$ is connected to an input of a gain stage $64_m$ through a switch $66_m$ and to a source of operating potential such as, for example, ground through a switch $70_m$, i.e., output $54O_{2,m}$ is switchably coupled to the input of gain stage $64_m$ through switch $66_m$ and to the source of operating potential through switch $70_m$. Output $54O_{1,m}$ is connected to another input of gain stage $64_m$ through a switch $68_m$, i.e., output $54O_{1,m}$ is switchably connected to the other input of gain stage $64_m$. An output of gain stage $64_m$ is connected to an input of an analog-to-digital converter (ADC)$72_m$. By way of example, gain stage $64_m$ is an operational amplifier having an inverting input, a non-inverting input, and an output. Thus, output $54O_{2,m}$ is switchably connected to the inverting input of operational amplifier $64_m$, output $54O_{1,m}$ is switchably connected to the non-inverting input of operational amplifier $64_m$, and the output of operational amplifier $64_m$ is connected to an input of an analog-to-digital converter (ADC)$72_m$. One or more outputs $72_q$ of ADC$72_m$ is connected to one or more corresponding inputs of logic circuit $30_m$. By way of example, ADC$72_m$ is a 10 bit analog-to-digital converter and therefore has ten outputs $72_q$ coupled to corresponding inputs of logic circuit $30_m$. ADC$72_m$ generates measurement results that appear at outputs $72_q$. A control input of ADC$72_m$ is coupled for receiving a source of operating potential such as, for example $V_{CCm}$. A voltage regulator $76_m$ has an input coupled for receiving a reference potential or voltage reference $V_{REFm}$ from a reference voltage source $75_m$, an input coupled to supply input terminal $54P_m$ for receiving another source of operating potential $V_{PP}$, and an input coupled for receiving a source of operating potential such as, for example, ground, at input $54M_m$. The output of voltage regulator $76_m$, i.e., supply $VCC_m$, is commonly connected to the reference input of ADC$72_m$ and as a supply of IFL circuit $28_m$. Source of operating potential $V_{CCm}$, i.e., supply $V_{CCm}$, is derived from reference voltage $V_{REFm}$. It should be noted that reference voltage source $75_m$ serves as a voltage reference and the output of voltage regulator $76_m$ serves as supply output $VCC_m$ and as a supply and a reference for ADC$72_m$. Supply VCCm also serves as a supply input for battery monitor control unit $16_{m-1}$. Preferably, an external capacitor $77_m$ is coupled between supply $VCC_m$ and node $54M_m$ to stabilize supply voltage $VCC_m$. A capacitor $78_m$ has a terminal connected to node $36_m$ and a terminal connected to node $38_m$. Nodes $36_m$ and $38_m$ are also referred to as stabilization nodes or ports.

In accordance with an embodiment of the present invention, multiplexer $54_m$ comprises a switch $80_{0,m}$ having a terminal that serves as input $54I_{0,m}$ and a terminal connected to output $54O_{1,m}$ and a switch $80_{(n+1),m}$ having a terminal that serves as input $54I_{(n+1),m}$ and a terminal connected to output $54O_{2,m}$. In addition, multiplexer $54_m$ includes a switch $80_{1,m}$ having a terminal that serves as input $54I_{1,m}$, a terminal connected to output $54O_{1,m}$ and a terminal connected to output $54O_{2,m}$, a switch $80_{2,m}$ having a terminal that serves as input $54I_{2,m}$, a terminal connected to output $54O_{1,m}$ and a terminal connected to output $54O_{2,m}$, a switch $80_{3,m}$ having a terminal that serves as input $54I_{3,m}$, a terminal connected to output $54O_{1,m}$ and a terminal connected to output $54O_{2,m}$, ..., a switch $80_{(n-1),m}$ having a terminal that serves as input $54I_{(n-1),m}$, a terminal connected to output $54O_{1,m}$ and a terminal connected to output $54O_{2,m}$, and a switch $80_{n,m}$ having a terminal that serves as input $54I_{n,m}$, a terminal connected to output $54O_{1,m}$ and a terminal connected to output $54O_{2,m}$. By way of example, switches $80_{0,m}$ and $80_{(n+1),m}$ are single pole single throw switches and switches $80_{1,m}, \ldots, 80_{n,m}$ are single pole double throw switches.

Figure 7:
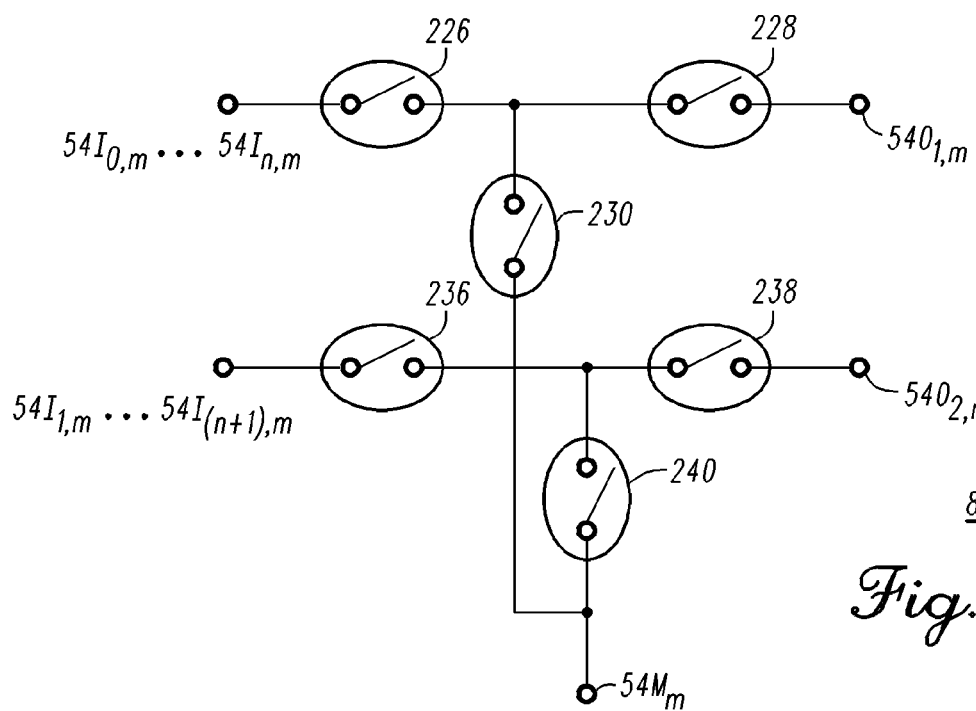
FIG. 7 is a schematic diagram of a switch suitable for use with battery systems in accordance with the present invention.

Briefly referring to FIG. 7, an alternative switch network 80A suitable for use in multiplexer $54_m$ is illustrated. In accordance with embodiments of the present invention, switches $80_{0,m}, 80_{1,m}, 80_{2,m}, \ldots, 80_{(n-1),m}, 80_{n,m}, 80_{(n-1),m}$ can be replaced with switching network 80A. Switching network 80A comprises switches 226 and 236 where terminals of switches 226 and 236 are connected to inputs $54I_{0,m}, 54I_{1,m}, 54I_{2,m}, \ldots, 54I_{(n-1),m}, 54I_{n,m}, 54I_{(n+1),m}$. The other terminal of switch 226 is connected to terminals of switches 228 and 230. The other terminal of switch 228 is connected to output $54O_{1,m}$ and the other terminal of switch 230 is connected to terminal $54M_m$. The other terminal of switch 236 is connected to terminals of switches 238 and 240. The other terminal of switch 238 is connected to output $54O_{2,m}$ and the other terminal of switch 240 is connected to terminal $54M_m$. Switches 226, 228 and 230 are used to connect the top-side of the cell $20_{n,m}$ to be measured. The connection for cell $20_{n,m}$ from $54I_{(n-1),m}$ to $54O_{1,m}$ is valid when switches 226 and 228 are closed and switch 230 is open. The connection is broken when switches 226 and 228 are open and the switch 230 is closed to $54M_m$. No cross-coupling through the open-switches 226 or 228 will influence input $54I_{(n-1),m}$ or output $54O_{1,m}$ because any cross-coupling through the switches 226 or 228 is shorted too $54M_m$. Switches 236, 238 and 240 are used to connect the bottom-side of the cell $20_{n,m}$ to be measured. The connection for cell $20_{n,m}$ from $54I_{n,m}$ to $54O_{2,m}$ is valid when switches 236 and 238 are closed and switch 240 is open. The connection is broken when switches 236 and 238 are open and the switch 240 is closed to $54M_m$. No cross-coupling through the open-switches 236 or 238 will influence input $54I_{(n-1),m}$ or output $54O_{1,m}$ because any cross-coupling through the switches 226 or 228 is shorted too $54M_m$.

In addition, FIG. 1 illustrates a battery unit $20_m$ which comprises a series connected plurality of battery cells $20_{1,m}, 20_{2,m}, 20_{3,m}, \ldots, 20_{(n-1),m}, 20_{n,m}, 20_{(n+1),m}$. More particularly, a positive terminal of battery cell $20_{1,m}$ is coupled to input $54I_{0,m}$ through a resistor $86_{0,m}$, a positive terminal of battery cell $20_{2,m}$ and a negative terminal of battery cell $20_{1,m}$ are commonly coupled to input $54I_{1,m}$ through a resistor $86_{1,m}$, a positive terminal of battery cell $20_{3,m}$ and a negative terminal of battery cell $20_{2,m}$ are commonly coupled to input $54I_{2,m}$ through a resistor $86_{2,m}$, a negative terminal of battery cell $20_{3,m}$ is coupled to input $54I_{3,m}$ through a resistor $86_{3,m}, \ldots$, a positive terminal of battery cell $20_{n,m}$ and a negative terminal of battery cell $20_{(n-1),m}$ are commonly coupled to input $54I_{(n-1),m}$ through a resistor $86_{(n-1)}$, a positive terminal of battery cell $20_{(n+1),m}$ and a negative terminal of battery cell $20_{n,m}$ are commonly coupled to input $54I_{n,m}$ through a resistor $86_{n,m}$, and a negative terminal of battery cell $20_{(n+1),m}$ is coupled to input $54Im_{,(n+1)}$ through a resistor $86_{(n+1),m}$. A capacitor $88_{1,m}$ has a terminal connected to input $54I_{0,m}$ and a terminal connected to input $54I_{1,m}$, a capacitor $88_{2,m}$ has a terminal connected to input $54I_{1,m}$ and a terminal connected to input $54I_{2,m}$, a capacitor $88_{3,m}$ has a terminal connected to input $54I_{2,m}$ and a terminal connected to input $54I_{3,m} \ldots$, a capacitor $88_{(n-1),m}$ has a terminal connected to input $54I_{(n-1),m}$, a capacitor $88_{n,m}$ has a terminal connected to input $54I_{(n-1),m}$ and a terminal connected to input $54I_{n,m}$, and a capacitor $88_{(n+1),m}$ has a terminal connected to input $54I_{n,m}$ and a terminal connected to input $54I_{(n+1),m}$. A capacitor $90_m$ has a positive terminal connected to supply input terminal $54P_m$ and a negative terminal connected to supply input terminal $54M_m$. Resistors $86_{0,m}$, $86_{1,m}$, ..., $86_{(n-1),m}$, $86_{n,m}$, $86_{(n+1),m}$ cooperate with corresponding capacitors $88_{1,m}$, $88_{2,m}$, ..., $88_{(n-1),m}$, $88_{n,m}$, $88_{(n+1),m}$ to filter any signal noise that may occur at inputs $54I_{0,m}$, $54I_{1,m}$, ..., $54I_{(n-1),m}$, $54I_{n,m}$, $54I_{(n+1),m}$. It should be noted that resistors $86_{0,m}$, $86_{1,m}$, ..., $86_{(n-1),m}$, $86_{n,m}$, $86_{(n+1),m}$ and capacitors $88_{1,m}$, $88_{2,m}$, ..., $88_{(n-1),m}$, $88_{n,m}$, $88_{(n+1),m}$ may also be connected in different configurations as long as they filter the signal noise and protect inputs $54I_{0,m}$, $54I_{1,m}$, ..., $54I_{(n-1),m}$, $54I_{n,m}$, $54I_{(n+1),m}$ against voltage transients that could damage input circuitry.

Figure 2A:
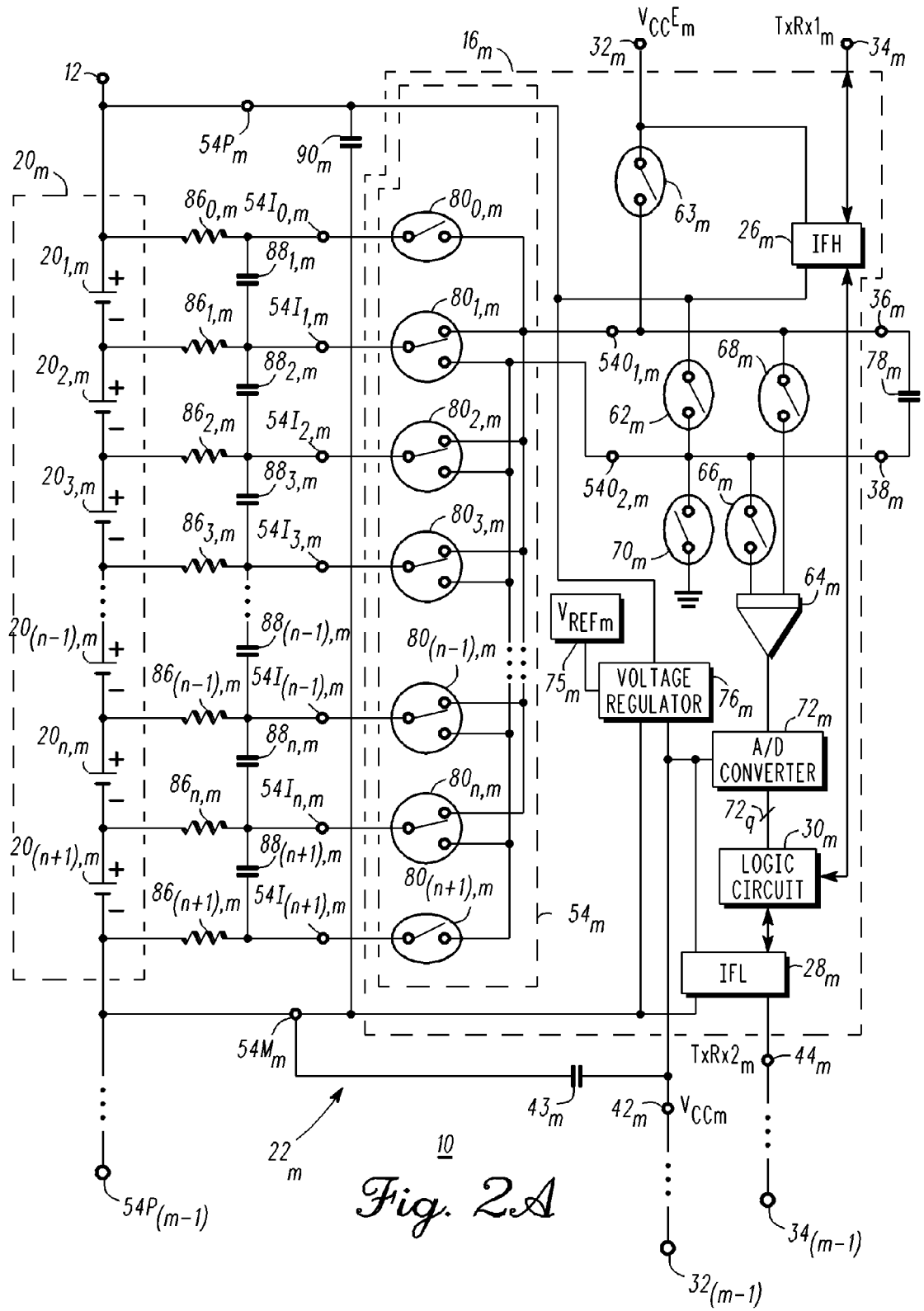
FIGS. 2A, 2B, and 2C are a schematic diagram of a battery system in accordance with an embodiment of the present invention.
Figure 2B:
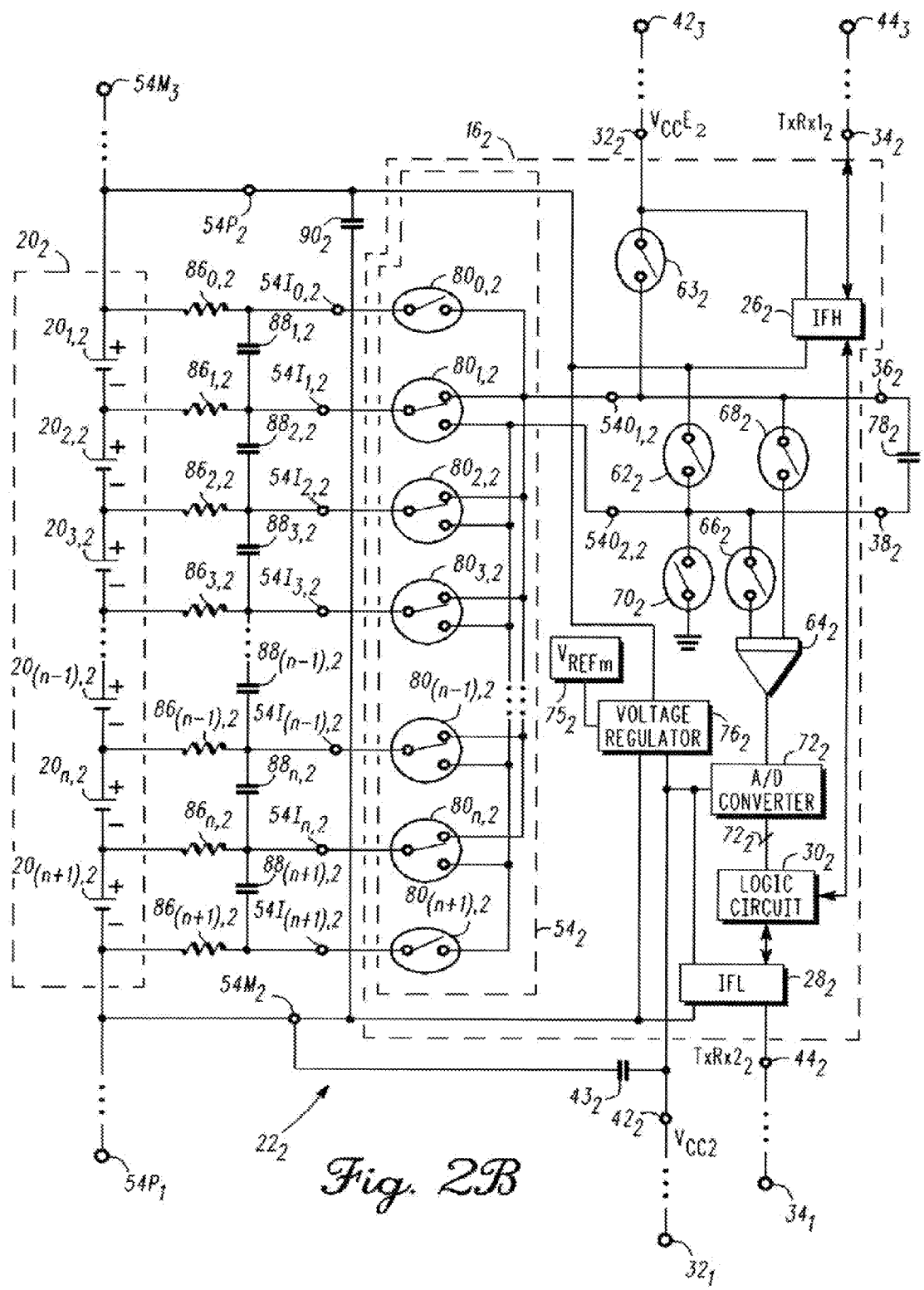
Figure 2C:
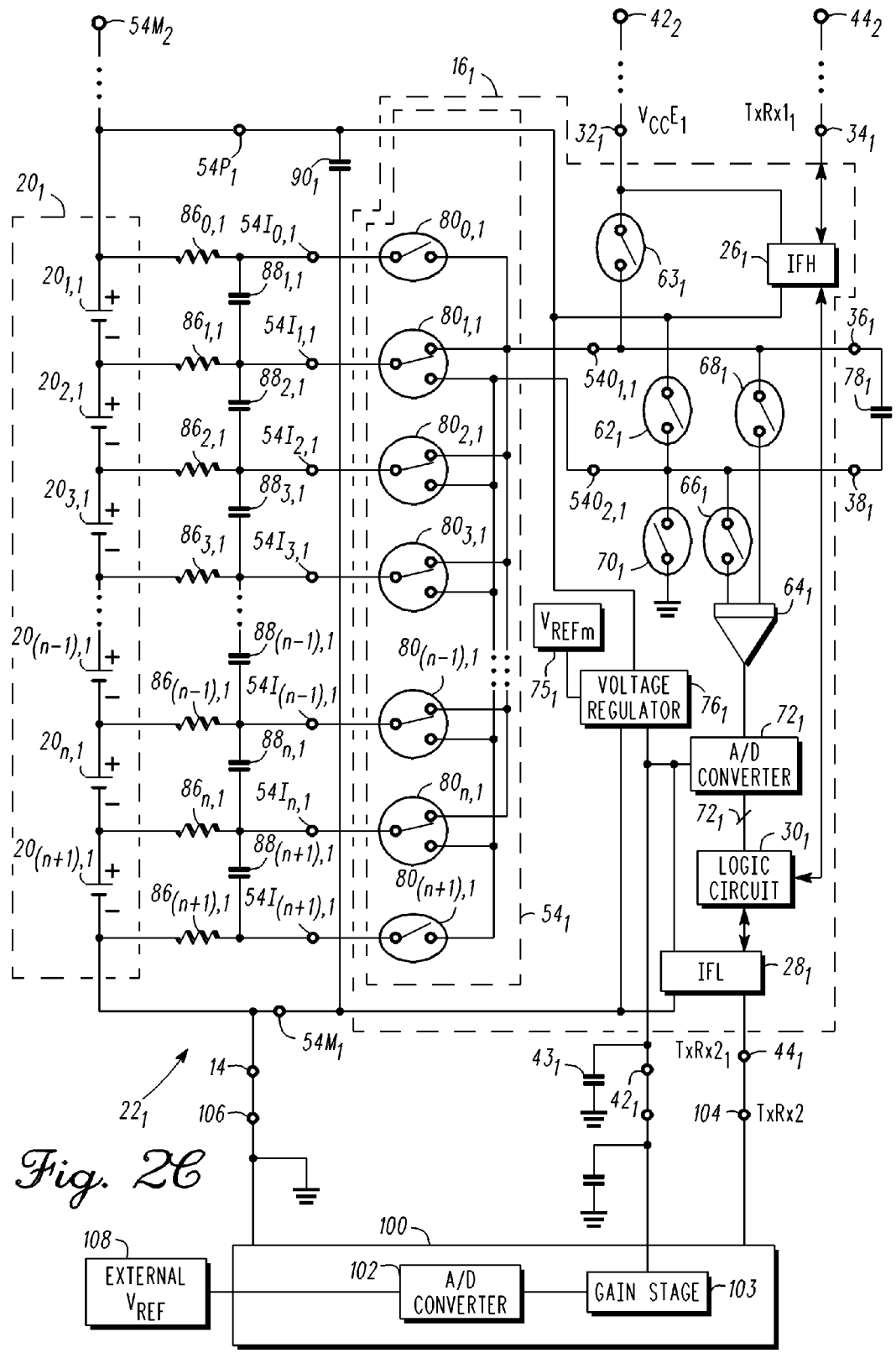

FIGS. 2A, 2B, and 2C are a schematic diagram of a battery system 10 having battery terminals 12 and 14. For the sake of clarity, battery system 10 has been drawn on three separate sheets where reference characters "A," "B," and "C" have been appended to reference character "2" to distinguish the sheets. It should be noted that FIGS. 2A, 2B, and 2C are intended to be viewed together. Battery system 10 is comprised of a plurality of local battery modules $22_m$ in which battery monitor control units $16_m$ are coupled in a daisy-chain configuration to a controller 100. It should be noted that the daisy-chain configuration is realized by connecting a data or data input/output node $34_m$ to a succeeding data or data input/output node $44_m$. The daisy-chain connection will be further described below. What is shown in FIGS. 2A, 2B, and 2C are battery monitor control units $16_1$, $16_2$, ..., $16_m$ connected to battery units $20_1$, $20_2$, ..., $20_m$, respectively. As previously discussed, battery monitor control units $16_m$ are coupled to corresponding battery units $20_m$ to form local battery control modules $22_m$. Thus, battery monitor control unit $16_1$ is coupled to battery unit $20_1$ to form a local battery module $22_1$, battery monitor control unit $16_2$ is coupled to battery unit $20_2$ to form a local battery module $22_2$, ..., and battery monitor control unit $16_m$ is coupled to battery unit $20_m$ to form a local battery module $22_m$. Battery monitor control units $16_1$, $16_2$, ..., $16_m$ and corresponding battery units $20_1$, $20_2$, ..., $20_m$ are not limited to being directly adjacent to each other. Accordingly, battery monitor control units $16_1$, $16_2$, ..., $16_m$ may be on one or more Printed Circuit Boards (PCBs), while battery units $20_1$, $20_2$, ..., $20_m$ may be close to the PCB containing the corresponding battery monitor control units $16_1$, $16_2$, ..., $16_m$. For example, battery monitor control unit $16_1$ may be on one PCB with battery unit $20_1$ near battery monitor unit $16_1$ whereas battery control unit $16_m$ may be on a different PCB with battery unit $20_m$ near battery monitor unit $16_m$. It should be noted that FIGS. 2A, 2B, and 2C illustrate a plurality of battery monitor control units $16_m$ coupled together and a plurality of battery units $20_m$ coupled to corresponding battery monitor control units $16_m$ in a daisy-chain configuration, whereas FIG. 1 illustrates a single battery monitor control unit $16_m$ to which a single battery unit $20_m$ is connected. It should be noted that subcripts m and n have been included in FIGS. 1 and 2 to distinguish the circuit elements of battery monitor control units $16_m$ from each other and to distinguish the circuit elements of battery units $20_m$ from each other.

Still referring to FIG. 2, a main controller 100 is connected to battery monitor control unit $16_1$. Main controller 100 has an ADC 102 coupled to $V_{CC}$ input $42_1$ through a gain stage 103 and a data node 104 connected to data node $44_1$ of battery monitor control unit $16_1$. An input 106 of main controller 100 is connected to battery terminal 14 of battery unit $20_1$. Terminal 14 is coupled for receiving a source of operating potential such as, for example, ground, which serves as a local ground. An external reference voltage 108 for providing a reference voltage $V_{REF}$ is connected to main controller 100.

In operation, battery monitor control unit $16_1$ and controller 100 communicate with each other through data nodes $44_1$ and 104. Because battery monitor control unit $16_1$ and controller 100 are connected in a daisy-chain configuration that is bidirectional, controller 100 can send data to or receive data from battery monitor control units $16_1$, ..., $16_m$. Controller 100 is capable of sending data to or receiving data from selected battery monitor control units $16_1$, ..., $16_m$. In accordance with an embodiment, controller 100 assigns addresses for the battery monitor control units $16_1$, ..., $16_m$ at initialization. Accordingly, at start-up, addresses are not assigned to battery monitor control units $16_1$, ..., $16_m$. Controller 100 communicates with battery monitor control unit $16_1$, i.e., the battery monitor control unit to which it is directly connected, and assigns it an address. Thus, battery monitor control unit $16_1$ serves as a slave. Once battery monitor control unit $16_1$ has an address, controller 100 allows it to send a command to the next battery monitor control unit and controller 100 assigns an address to this battery monitor control unit. Once this second battery monitor control unit has received an address, the communication to the next battery monitor control unit is enabled. Controller 100 continues this process until all the battery monitor control units are enabled. After controller 100 assigns the addresses, it can communicate with each of battery monitor control units $16_1$, ..., $16_m$. The daisy chain connection through data nodes $44_1$ and 104 can be a single connection for single ended communication, two connections for differential communication, or a serial peripheral interface (SPI), or the like. Differential communication permits communication at higher baud rates with a more acceptable electromagnetic emission than can be achieved with single ended communication.

Controller 100 instructs battery monitor control unit $16_1$ to measure the voltages of cells $20_{1,1}$, ..., $20_{(n-1),1}$, $20_{n,1}$, $20_{(n+1),1}$. In response to the instructions from controller 100, logic circuit $30_1$ actuates switches $80_{0,1}$, ... $80_{(n-1),1}$, $80_{n,1}$, $20_{(n+1),1}$ of multiplexer $54_1$ so that the voltage across the desired cell can be measured, i.e., switches $80_{0,1}$, ..., $80_{(n-1),1}$, $80_{n,1}$, $80_{(n+1),1}$ are set to select a pair of input nodes $54I_{0,1}$, $54I_{1,1}$, ..., $54I_{(n-1),1}$, $54I_{n,1}$, $54I_{(n+1),1}$ which are connected to the desired cell to be measured. For example, to measure cell $20_{2,2}$ of battery unit $20_2$, ports $54I_{1,1}$, and $54I_{2,1}$ are selected as inputs. Capacitor $78_2$ charges to the potential of the cell under test. Once capacitor $78_2$ is charged, multiplexer $54_2$ is opened and capacitor $78_2$ floats. Logic circuit $30_2$ closes switches $68_2$, $66_2$, and $70_2$ thereby applying the voltage that is across capacitor $78_2$ as an input to gain stage $64_2$. The output of gain stage $64_2$ is applied to ADC $72_2$, which uses voltage $VCC_2$ as a reference voltage. ADC $72_2$ generates an output signal that is a digital value of the voltage for cell $20_{2,2}$ and serves as the measurement data. Typically, battery monitor control units $16_1$, ..., $16_m$ take measurements in a cyclic fashion and store the data in corresponding storage elements until controller 100 requests the information. The data is stored in storage elements (not shown) that form portions of logic circuits $30_1$, ..., $30_m$. Alternatively, the measurement data can be transferred directly to controller 100. In a next cycle, capacitor $78_2$ is charged to the voltage of another cell under test, e.g., one of cells $20_{1,2}$, $20_{3,2}$, ..., $20_{(n+1),2}$. It should be noted that the next measurement can be performed without discharging capacitor $78_2$ and that the desirable charging of capacitor $78_2$ can be achieved by adding extra diagnostics to ensure that none of pins $54I_{2,n}$ are open or floating. Typically, controller 100 causes the cells of a battery unit $20_m$ to be measured in a sequence such that the first cell measured is between pair of nodes $54I_{0,2}$ and $54I_{1,2}$ and the last cell measured is between nodes $54I_{n,2}$ and $54I_{(n+1),2}$.

Switches $62_2$ and $63_2$ are included to measure voltage $V_{CC}E_2$. More generally, switches $62_n$ and $63_n$ are included to measure corresponding voltages $V_{CC}E_m$.

Figure 3:
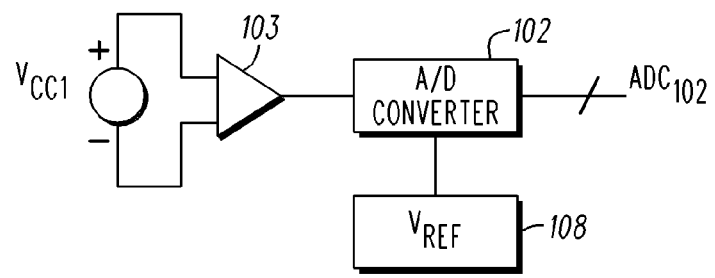
FIG. 3 is a schematic diagram of a portion of the battery system of FIG. 1.

In accordance with embodiments of the present invention, a calibration or correction factor $CORR_{100}$ for battery monitor control unit $16_1$ can be determined using the circuit elements shown in FIG. 3. ADC102 is used to measure voltage $V_{CC1}$ and the resulting correction factor is used to correct the error of battery monitor control unit $16_1$. What is shown in FIG. 3 is ADC102 coupled for receiving an input signal from gain stage 103 and a reference voltage $V_{REF108}$ from a precision external reference voltage source 108. Gain stage 103 receives a voltage $V_{CC1}$ from battery monitor control unit $16_1$ and ADC102 outputs digital values $ADC_{102}$ for main controller 100. Voltage $V_{CC1}$ output by voltage regulator $76_m$ is given by Equation 1 (EQT. 1) as:

$$V_{CC1} = K_{103} * (ADC_{102(VREF108)}/FS_{100}) * V_{REF108} \qquad \text{EQT. 1}$$

where:

$K_{103}$ is a gain factor for gain stage 103 and $ADC_{102}$;

$ADC_{102(VREF108)}$ is the digital value for the voltage from voltage regulator $76_1$ that is output by ADC102;

$FS_{100}$ is a full scale factor for ADC102; and $V_{VREF108}$ is a reference voltage derived from precision reference voltage source 108.

Setting voltage $V_{CC1}$ equal to $V_{REF108}$ in EQT. 1 and solving for gain factor $K_{103}$ yields EQT. 2, which is used in the calibration for ADC102.

$$K_{103} = FS_{100}/ADC_{102(VREF108)}. \qquad \text{EQT. 2}$$

Substituting gain factor $K_{103}$ of EQT. 2 into EQT 1 yields EQT. 3:

$$V_{CC1} = (ADC_{102(VCC1)}/ADC_{102(VREF108)}) * V_{(VREF108)}. \qquad \text{EQT. 3}$$

The correction factor $CORR_{100}$ is defined as the ratio of the voltage at the output of voltage regulator $76_1$, i.e., $V_{CC1}$, to the voltage at the output of reference voltage source 108, i.e., $V_{REF108}$. Rearranging EQT. 3 yields EQT. 4, i.e., an equation defining correction factor $CORR_{100}$:

$$CORR_{100} = V_{CC1}/V_{REF108} = ADC_{102}(VCC1)/ADC_{102(VREF108)}. \qquad \text{EQT. 4}$$

Correction factor $CORR_{100}$ is used to correct the voltages of battery cells $20_{1,1}, \ldots, 20_{n,1}$ of battery monitor control unit $16_1$.

Figure 4:
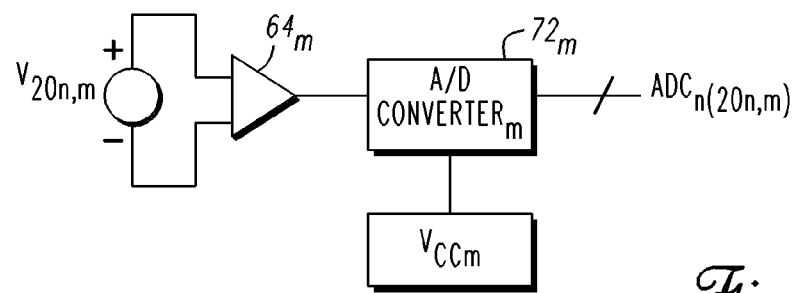
FIG. 4 is a schematic diagram of another portion of the battery system of FIG. 1.

Using the schematic shown in FIG. 4, the cell voltage $V_{20n,1}$ of battery cell $20_{n,1}$ of local battery module $22_1$ is given by EQT. 5 as:

$$V_{20n,1} = K_1 * (ADC72_{1(20n,1)}/FS_1) * V_{CC1} \qquad \text{EQT. 5}$$

where:

$K_1$ is a gain factor for gain stage $64_1$ and $ADC72_1$;

$ADC72_{1(20n,1)}$ is the digital value for battery cell $20_{n,1}$ that is output by $ADC72_1$;

$FS_1$ is a full scale factor for $ADC72_1$; and $V_{CC1}$ is a source of operating potential derived from local reference $V_{REF1}$.

In the calibration process for $ADC72_1$, setting voltage $V_{20n,1}$ equal to voltage $V_{CC1}$ in EQT. 5 and solving for gain factor $K_1$ yields EQT. 6:

$$K_1 = FS_1/ADC72_{1(20n,1)} \qquad \text{EQT. 6}$$

Substituting gain factor $K_1$ of EQT. 6 into EQT. 5 yields EQT. 7:

$$V_{20n,1} = ADC72_{1(20n,1)}/ADC72_{1(VCC1)} * V_{CC1} \qquad \text{EQT. 7}$$

Substituting correction factor $CORR_{100}$ into EQT. 7 yields EQT. 8, which gives the corrected cell voltage $VCORR_{20n,1}$:

$$VCORR_{20n,1} = (ADC72_{1(20n,1)}/ADC72_{1(VCC1)}) * CORR_{100} * V_{(VREF108)}. \qquad \text{EQT. 8}$$

Correction factors can be determined for each battery monitor control unit $16_m$ using the circuit elements shown in FIG. 4 and equations similar to equations 1-8. For example, a correction factor $CORR_1$ may determined as follows:

$$V_{CC2} = (ADC72_{1(VCC2)}/ADC72_{1(VCC1)}) * V_{CC1}$$

where:

$ADC72_{1(VCC1)}$ is the digital value for the voltage from voltage regulator $76_1$ that is output by $ADC72_1$;

$ADC72_{1(VCC2)}$ is the digital value for the voltage from voltage regulator $76_2$ that is output by $ADC72_1$.

The correction factor $CORR_1$ for battery monitor control unit $16_2$ is given by EQT. 9:

$$CORR_1 = V_{CC2}/V_{CC1} = (ADC72_{1(VCC2)}/ADC72_{1(VCC1)}). \qquad \text{EQT. 9}$$

The cell voltage $V_{20n,2}$ of battery cell $20_{n,2}$ of local battery module $22_2$ is given by EQT. 10 as:

$$V_{20n,2} = (ADC72_{2(20n,2)}/ADC72_{2(VCC2)}) * V_{CC2} \qquad \text{EQT. 10}$$

where:

$ADC72_{2(20n,2)}$ is the digital value for battery cell $20_{n,2}$ that is output by $ADC72_2$; and $V_{CC2}$ is a source of operating potential derived from local reference $V_{REF2}$.

Substituting correction factor $CORR_1$ into EQT. 10 yields EQT. 11, which gives the corrected cell voltage $VCORR_{20n,2}$:

$$VCORR_{20n,2} = (ADC72_{2(20n,2)}/ADC72_{2(VCC2)}) * CORR_1 * CORR_{100} * V_{(VREF108)} \qquad \text{EQT. 11}$$

By combining all the correction factors, the measurements of all the cells are correlated with the same precision reference, i.e., voltage reference 108. Thus, corrected cell voltages $VCORR_{20n,m}$ are given by:

$$VCORR_{20n,m} = (ADC72_{m(20n,m)}/(ADC72_{m(VCCm)}) * CORR_{(m-1)} * \ldots * CORR_2 * CORR_1 * CORR_{100} * V_{(VREF108)}. \qquad \text{EQT 12}$$

Controller 100 applies the corresponding correction factor to the output signals of corresponding analog-to-digital converters $ADC72_1$, $ADC72_2$, ..., $ADC72_m$.

In a calibration step, logic circuits $30_m$ generate control logic signals which cause battery monitor control units $16_m$ to perform a series of measurements that include measuring zero voltages across sampling capacitors $78_m$ and measuring local reference voltages $V_{CCm}$ across sampling capacitors $78_m$. The zero voltages across sampling capacitors $78_m$ are used to correct voltage offset that may appear in battery control units $16_m$ and the local reference voltage measurement, i.e., the measurement of voltages $V_{CCm}$, is used to calibrate the gain of the measurement channel. The zero voltage across capacitors $78_m$ is measured by setting the voltages at nodes $36_m$ and $38_m$ equal to each other and the voltage at node $38_m$ substantially equal to a ground potential. The local voltage reference measurement is achieved by setting the voltage at node $36_m$ substantially equal to reference voltage $V_{CCm}$ and the voltage at node $38_m$ substantially equal to a ground potential. The voltages between these two points can be corrected using interpolation or through a local correction factor of $ADC72_m$.

Figure 5A:
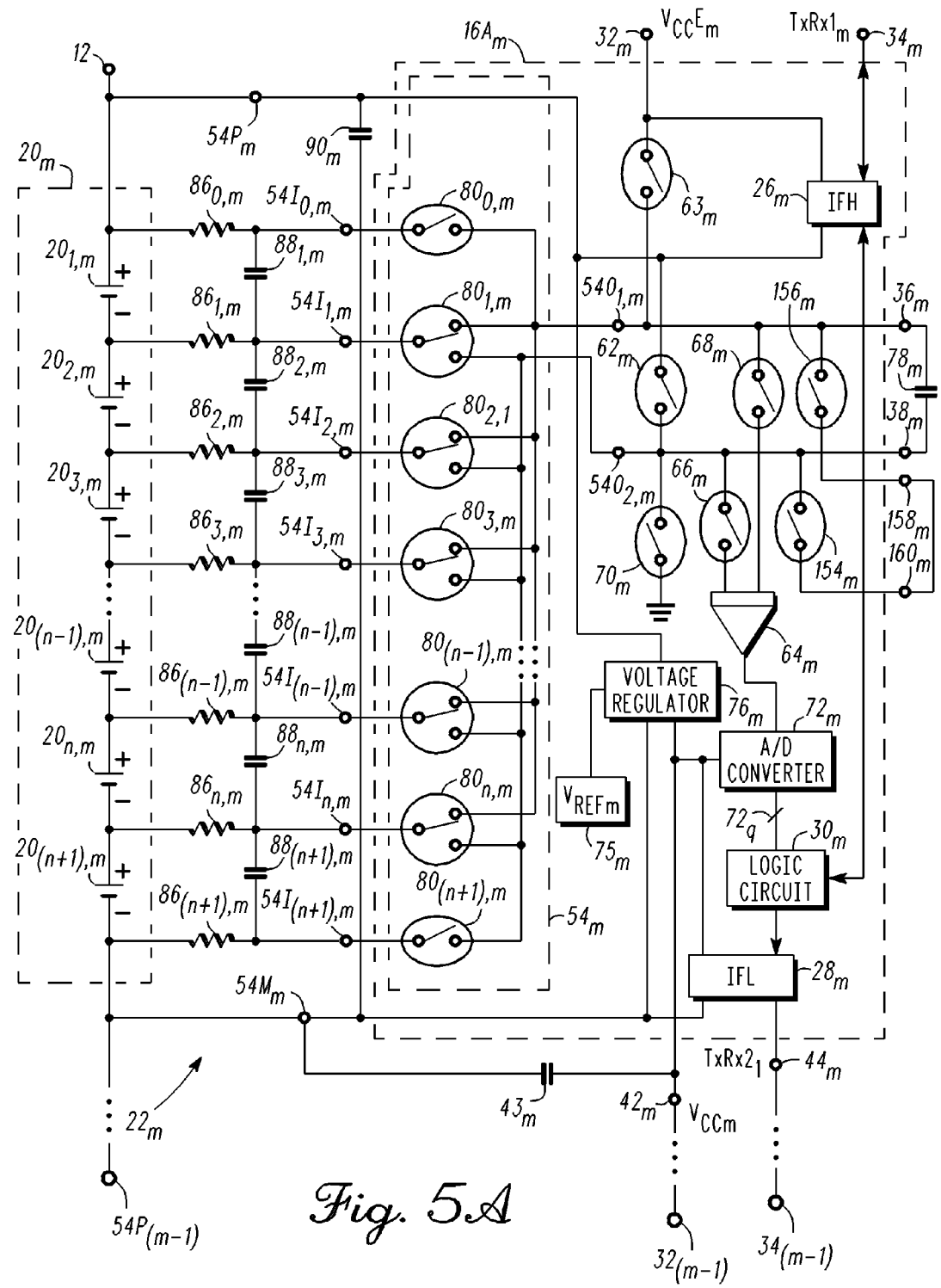
FIGS. 5A, 5B, and 5C are a schematic diagram of a battery system in accordance with another embodiment of the present invention.
Figure 5B:
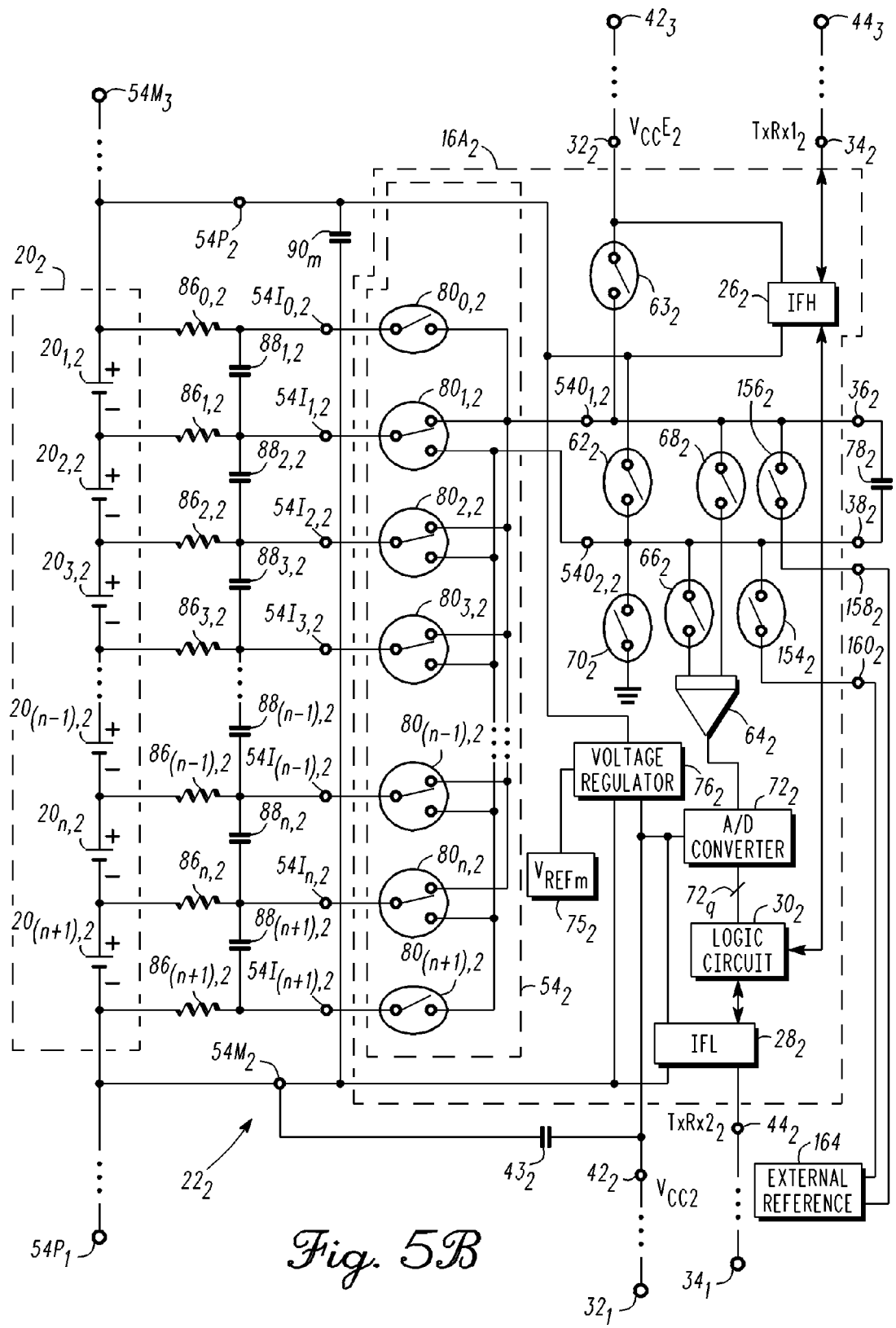
Figure 5C:
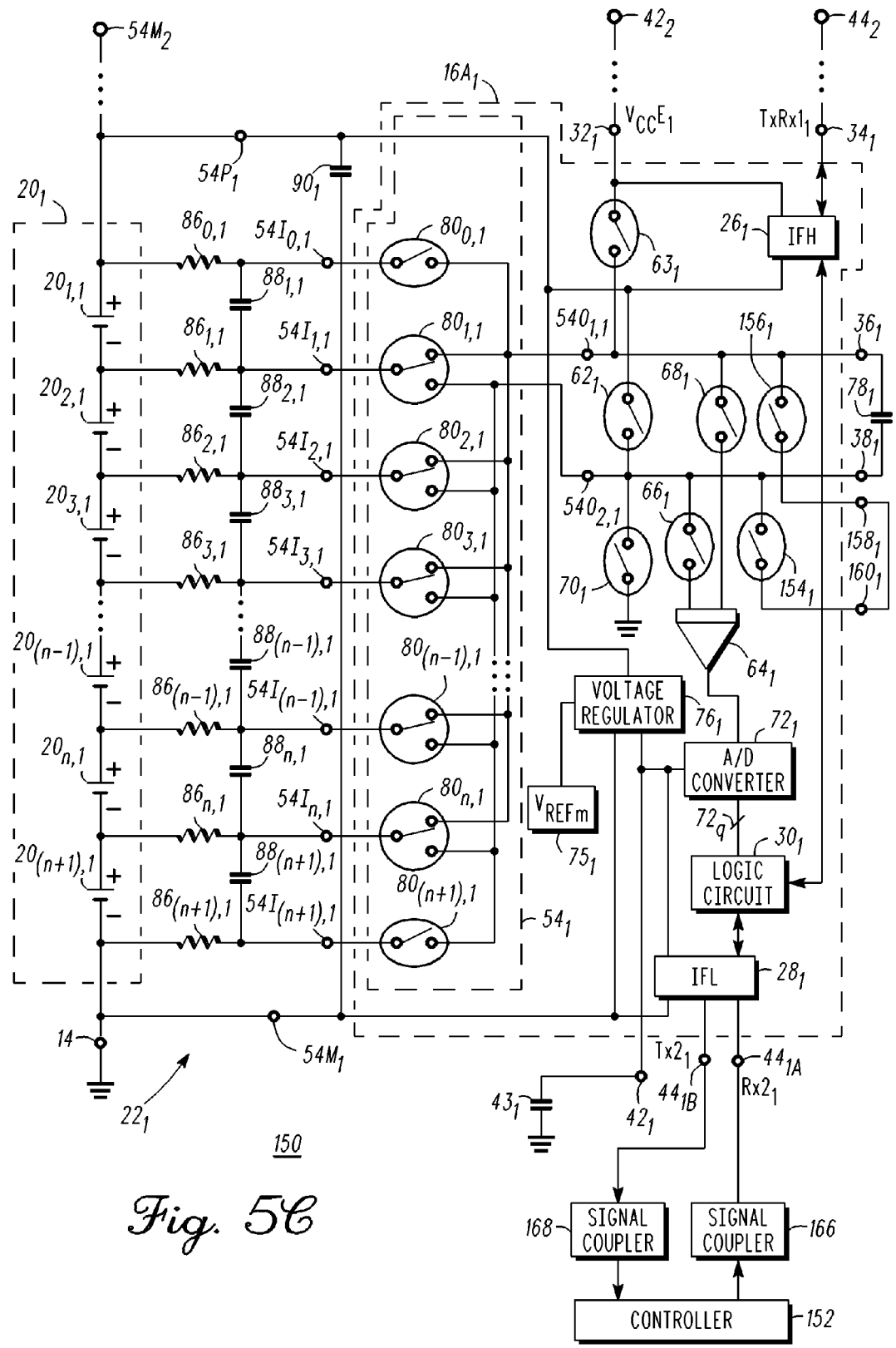

FIGS. 5A, 5B, and 5C are a schematic diagram of a battery system 150 in accordance with another embodiment of the present invention. For the sake of clarity, battery system 10 has been drawn on three separate sheets where reference characters "A," "B, " and "C" have been appended to reference character "5" to distinguish the sheets. It should be noted that FIGS. 5A, 5B, and 5C are intended to be viewed together. Like battery system 10, battery system 150 is comprised of a plurality of local battery modules in which battery monitor control units $16A_m$ are coupled in a daisy-chain configuration to a controller. Battery monitor control units $16A_m$ are similar to battery monitor control units $16_m$, except that they have additional switches and input/output nodes. Thus, battery system 150 differs from battery system 10 in that each battery monitor control unit includes a switch $154_m$ having a terminal connected to node $54O_{2,m}$ and a terminal connected to a node $160_m$ and a switch $156_m$ having a terminal connected to node $54O_{1,m}$ and a terminal connected to a node $158_m$. In addition, a precision external reference voltage 164 is connected to at least one set of nodes $158_m$ and $160_m$ rather than to a controller 152. By way of example, precision external reference voltage 164 is connected to nodes $158_2$ and $160_2$. The battery monitor control unit $16A_2$ to which precision external reference voltage 164 is connected is not a limitation of the present invention. The precision external reference voltage can be connected to battery monitor control unit $16A_1$, $16A_2$, $16A_3$, or $16A_m$. Controller 152 is connected to nodes $44_{1A}$ and $44_{1B}$ through signal couplers 166 and 168, respectively.

Correction factors for battery system 150 can be determined in a fashion similar to that for determining the correction factors for battery system 10. For example, the correction factors when integer "m" is three are given in EQTS. 13-15 as:

$$CORR_1 = V_{CC2}/V_{CC1} = (ADC72_{1(VCC2)})/ADC72_{1(VCC1)}; \quad \text{EQT. 13}$$

$$CORR_2 = V_{CC3}/V_{CC2} = (ADC72_{2(VCC3)})/ADC72_{2(VCC2)}; \quad \text{EQT. 14}$$

$$CORR_{VREF} = V_{CC2}/V_{REF} = (ADC72_{2(VCC2)})/ADC72_{2(VREF)}; \text{ and} \quad \text{EQT. 15}$$

$$CORR_{m-1} = V_{CCm}/V_{CC(m-1)} = ADC72_{m-1(VCCm)}/ADC72_{m-1(VCC(m-1))} \quad \text{EQT. 16}$$

The corrected ADC voltage for $ADC72_2$ can be calculated in the same way as for battery system 10: The uncorrected value is given by EQT. 17 as:

$$V_{20n,2} = (ADC72_{2(20n,2)}/ADC72_{2(VCC2)})*V_{CC2}. \quad \text{EQT. 17}$$

Applying the correction factor gives EQT. 18:

$$VCORR_{20n,2} = (ADC72_{2(20n,2)}/ADC72_{2(VCC2)})*CORR_{VREF}*V_{REF}. \quad \text{EQT. 18}$$

The corrected value for $ADC72_1$ can be obtained in the same way and is given by EQT. 19 and EQT. 20 as:

$$V_{20n,1} = (ADC72_{1(20n,1)}/ADC72_{1(VCC1)})*V_{CC1} \quad \text{EQT. 19}$$

$$VCORR_{20n,1} = (ADC72_{1(20n,1)}/ADC72_{1(VCC1)})*1/CORR_1*CORR_{VREF}*V_{(VREF)} \quad \text{EQT. 20}$$

For battery monitor control units higher than battery monitor control unit $16_2$, the corrected values are given by EQT. 21 and EQT. 22 as:

$$V_{20n,m} = (ADC72_{m(20n,m)}/ADC72_{m(VCCm)})*V_{CCm} \quad \text{EQT. 21}$$

$$VCORR_{20n,m} = (ADC72_{m(20n,m)}/ADC72_{m(VCCm)})* CORR_{(m-1)}* \ldots *CORR_2*CORR_{VREF}* V_{(VREF)}. \quad \text{EQT. 22}$$

Thus, using the different correction factors, all the measured cell voltages can be corrected towards the precision of reference voltage 164.

Figure 6:
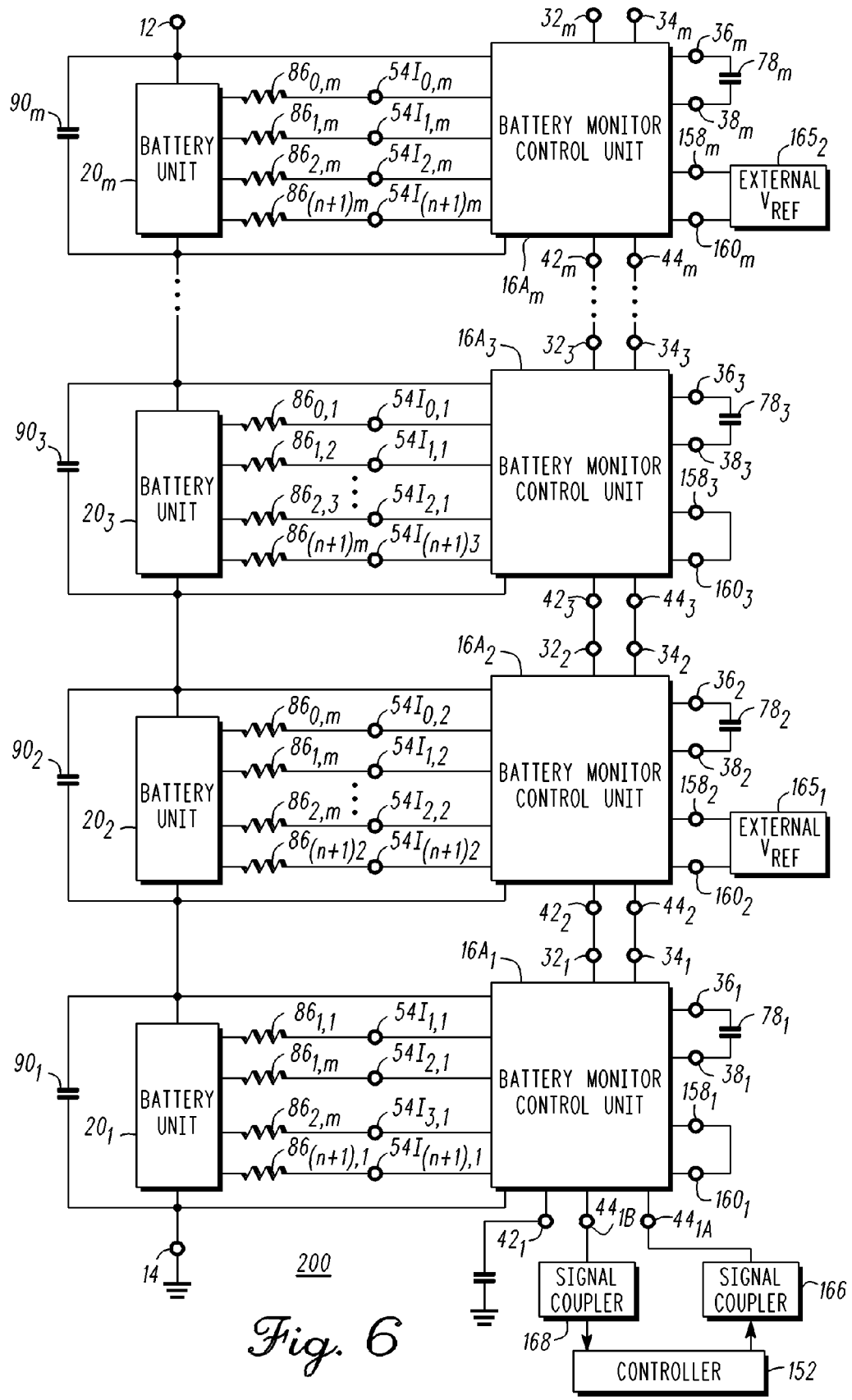
FIG. 6 is a schematic diagram of a battery system in accordance with another embodiment of the present invention.

The number of reference voltages associated with battery monitor control units $16A_1, \ldots, 16A_m$ is not a limitation of the present invention. FIG. 6 illustrates a battery system 200 in accordance with another embodiment of the present invention. What is shown in FIG. 6 is a battery system 200 that is similar to battery system 150 except that battery system 200 includes a precision external reference voltage $165_1$ connected to nodes $158_2$ and $160_2$ and a precision external reference voltage $165_2$ connected to nodes $158_m$ and $160_m$. Connecting an extra external reference voltage to more than one battery monitor control unit $16A_m$, i.e., connecting extra external reference voltage $165_1$ to battery monitor control unit $16A_2$ and connecting extra external reference voltage $165_2$ to battery monitor control unit $16A_m$, improves the overall accuracy and provides redundancy within the battery system. It should be noted that precision external reference voltages $165_1$ and $165_2$ may be at the same voltage level or at different voltage levels.

By now it should be appreciated that a method and structure for monitoring one or more batteries have been provided. In accordance with embodiments of the present invention, an internal reference voltage is input to an internal voltage regulator which generates a low voltage local supply voltage ($V_{CCm}$) that is stabilized by an external capacitor. The local supply voltage is input to another battery monitor control unit at input $32_m$ as serves as a voltage $V_{CC}E_m$. The measurement of the voltage at input $32_m$, i.e., voltage $V_{CC}E_m$ provides an indication of the voltage of the reference voltage used to generate the local supply voltage $V_{VCCm}$, which allows for the calculation of a correction factor for each battery monitor control unit. Connecting battery monitor control units $16_m$ in a daisy-chain configuration, i.e., the daisy-chain connection of voltages $V_{CCm}$ and $V_{CC}E_m$ enables the calculation of a correction factor for each battery monitor control unit $16_m$ within the daisy-chain. Using a precision voltage reference allows improving the absolute accuracy of the voltages within the daisy-chain. An accuracy of +/−0.2% can be achieved. Because the internal reference voltage is used as the reference for ADC's $72_m$, the accuracy of all the measurements carried out by ADC's $72_m$ are directly proportional to supply voltage $V_{CC}$. In addition, ADC's $72_m$ measure voltages $V_{CC}E_m$, which allows for correcting of all the ADC values including that of the controller.

Although specific embodiments have been disclosed herein, it is not intended that the invention be limited to the disclosed embodiments. Those skilled in the art will recognize that modifications and variations can be made without departing from the spirit of the invention. It is intended that the invention encompass all such modifications and variations as fall within the scope of the appended claims.

What is claimed is:

1. A method for monitoring one or more batteries, comprising:
    measuring a voltage of a first cell of a first battery using a first monitoring unit to generate a first measurement result, wherein measuring the voltage of the first cell of the first battery includes using a first reference voltage and simultaneously inputting the first reference voltage and a voltage generated in response to the voltage of the first cell into a first analog-to-digital (A/D) converter;
    measuring the first reference voltage using a controller to generate a second measurement result, wherein measuring the first reference voltage includes using a precise external reference voltage and simultaneously inputting the external reference voltage and a voltage generated in response to the first reference voltage into a second A/D converter, the second A/D converter in the controller; and
    using the first measurement result and the second measurement result to calculate a first correction factor suitable for use in correcting a set of measurements from at least one of the first and second monitoring units.

2. The method of claim 1, further including:
measuring a voltage of a second cell of the first battery using the first monitoring unit, wherein measuring the voltage of the second cell includes using the first reference voltage; and
using the first correction factor to correct the measurement of the voltage of the second cell.

3. The method of claim 1, further including:
measuring voltages of a plurality of additional cells of the first battery using the first monitoring unit, wherein measuring the voltages of the plurality of additional cells includes using the first reference voltage; and
using the first correction factor to correct the measurements of the voltages of the plurality of cells.

4. The method of claim 1, further including:
measuring a voltage of a first cell of a second battery using a second monitoring unit to generate a third measurement result, wherein measuring the voltage of the first cell of the second battery includes using a second reference voltage;
measuring the second reference voltage using the first monitoring unit to generate a fourth measurement result; and
using the third measurement result and the fourth measurement result to calculate a second correction factor suitable for use in correcting a set of measurements from at least one of the first and second monitoring units.

5. The method of claim 4, further including using the first and second correction factors to correct the set of measurements from at least one of the first and second monitoring units.

6. The method of claim 4, further including configuring at least one of the first and second monitoring units to measure a voltage across the first cell or a group of cells.

7. The method of claim 6, further including providing a first selectable input port for coupling to an adjacent monitoring unit and that is capable of measuring a voltage that is a function of the reference voltage of the adjacent monitoring unit and providing a second selectable input port for measuring a voltage of an external reference voltage.

8. The method of claim 4, further including using the controller to calculate the first and second correction factors.

9. The method of claim 4, further including: coupling the controller to at least one of the first and second monitoring units.

10. The method of claim 4, further including:
coupling the controller to at least one of the first and second monitoring units;
coupling the first reference voltage to the first monitoring unit; and
coupling the second reference voltage to the second monitoring unit.

11. The method of claim 1, further including:
measuring a first voltage at a first node in the first monitoring unit;
measuring a second voltage at a second node in a second monitoring unit;
using the first voltage at the first node and the second voltage at the second node to calculate a second correction factor suitable for use in correcting a set of measurements from at least one of the first and second monitoring units.

12. A method for monitoring one or more batteries, comprising:
configuring at least one of a first monitoring unit and a second monitoring unit to measure a voltage across a first cell or a group of cells;
providing a selectable input port to at least one of the first and second monitoring units, the selectable input port for coupling to a controller, the controller adjacent to at least one of the first and second monitoring units;
measuring a voltage of the first cell of a first battery using the first monitoring unit to generate a first measurement result, wherein measuring the voltage of the first cell of the first battery includes using a first reference voltage and simultaneously inputting the first reference voltage and a voltage generated in response to the measured voltage of the first cell into a first analog-to-digital (A/D) converter;
measuring the first reference voltage using the controller to generate a second measurement result, wherein measuring the first reference voltage includes using a precise external reference voltage and simultaneously inputting the external reference voltage and a voltage generated in response to the first reference voltage into a second A/D converter, the second A/D converter in the controller; and
using the first measurement result and the second measurement result to calculate a first correction factor suitable for use in correcting a set of measurements from at least one of the first and second monitoring units.

13. The method of claim 12, further including:
measuring a voltage of a second cell of the first battery using the first monitoring unit, wherein measuring the voltage of the second cell includes using the first reference voltage; and
using the first correction factor to correct the measurement of the voltage of the second cell.

14. The method of claim 12, further including:
measuring voltages of a plurality of additional cells of the first battery using the first monitoring unit, wherein measuring the voltages of the plurality of additional cells includes using the first reference voltage; and
using the first correction factor to correct the measurements of the voltages of the plurality of cells.

15. The method of claim 12, further including:
measuring a voltage of a first cell of a second battery using the second monitoring unit to generate a third measurement result, wherein measuring the voltage of the first cell of the second battery includes using a second reference voltage;
measuring the second reference voltage using the first monitoring unit to generate a fourth measurement result; and
using the third measurement result and the fourth measurement result to calculate a second correction factor suitable for use in correcting a set of measurements from at least one of the first and second monitoring units.

16. A method for monitoring one or more batteries, comprising:
coupling a controller to at least one of a first monitoring unit and a second monitoring unit;
coupling a first reference voltage of the first monitoring unit to a selectable port to measure a voltage of the first reference voltage;
measuring a voltage of a first cell of a first battery using the first monitoring unit to generate a first measurement result, wherein measuring the voltage of the first cell of the first battery includes using the first reference voltage and simultaneously inputting the first reference voltage and a voltage generated in response to the measured voltage of the first cell into a first analog-to-digital (A/D) converter;

measuring the first reference voltage using the second monitoring unit to generate a second measurement result, wherein measuring the first reference voltage includes using a precise external reference voltage, and simultaneously inputting the external reference voltage and a voltage generated in response to the measured first reference voltage into a second A/D converter in the second monitoring unit; and using the first measurement result and the second measurement result to calculate a first correction factor suitable for use in correcting a set of measurements from at least one of the first and second monitoring units.

17. The method of claim 16, further including using the controller to calculate the first correction factor.

18. The method of claim 16, further including:

measuring a voltage of a second cell of the first battery using the first monitoring unit, wherein measuring the voltage of the second cell includes using the first reference voltage; and using the first correction factor to correct the measurement of the voltage of the second cell.

19. The method of claim 16, further including:

measuring voltages of a plurality of additional cells of the first battery using the first monitoring unit, wherein measuring the voltages of the plurality of additional cells includes using the first reference voltage; and using the first correction factor to correct the measurements of the voltages of the plurality of cells.

20. The method of claim 16, further including:

measuring a voltage of a first cell of a second battery using the second monitoring unit to generate a third measurement result, wherein measuring the voltage of the first cell of the second battery includes using a second reference voltage;

measuring the second reference voltage using the first monitoring unit to generate a fourth measurement result; and using the third measurement result and the fourth measurement result to calculate a second correction factor suitable for use in correcting a set of measurements from at least one of the first and second monitoring units.

* * * * *